United States Patent [19]

Yaguchi

[11] Patent Number: 5,025,210
[45] Date of Patent: Jun. 18, 1991

[54] EVALUATION FACILITATING CIRCUIT DEVICE

[75] Inventor: Toshiyuki Yaguchi, Yokohama, Japan

[73] Assignee: Kabushiki Kaisha Toshiba, Kawasaki, Japan

[21] Appl. No.: 255,284

[22] Filed: Oct. 11, 1988

Related U.S. Application Data

[63] Continuation-in-part of Ser. No. 886,914, Jul. 18, 1986, abandoned.

[51] Int. Cl.$^5$ ............................................. G01R 19/00
[52] U.S. Cl. ................................. 324/158 R; 371/15.1; 324/73.1
[58] Field of Search ............ 324/73 PC, 73 AT, 73 R; 371/15, 20, 29.1

[56] References Cited

U.S. PATENT DOCUMENTS

| 3,961,251 | 6/1976 | Hurley et al. | 324/73 AT |
| 4,216,539 | 8/1980 | Raymond et al. | 371/20 |
| 4,622,669 | 11/1986 | Pri-Tal | 371/20 |
| 4,706,186 | 11/1987 | Mogi et al. | 371/20 |

FOREIGN PATENT DOCUMENTS

0077237A1 9/1982 European Pat. Off.

Primary Examiner—Reinhard J. Eisenzopf
Assistant Examiner—Edward Urban
Attorney, Agent, or Firm—Foley & Lardner, Schwartz, Jeffery, Schwaab, Mack, Blumenthal & Evans

[57] ABSTRACT

An evaluation facilitating circuit is for selectively evaluating each of block of a logical circuit to be checked which is divided into the plurality of blocks. The evaluation facilitating circuit includes a data hold circuit for selectively latching level signals of nodes of each of blocks and a data hold and transfer control circuit for controlling the data hold circuit.

2 Claims, 4 Drawing Sheets

EVALUATION FACILITATING CIRCUIT DEVICE

This is a continuation-in-part application based on application Ser. No. 886,914, filed July 18, 1986, now abandoned.

BACKGROUND OF THE INVENTION

1. Field of the Invention

The present invention relates to an evaluation facilitating circuit device for checking logical signal levels of each node of a logical circuit consisting of circuits, such as LSI circuits.

2 Description of the Prior Art

Conventionally, checking for simple logical circuits was carried out by use of a synchroscope or a tester, so as to detect logical signal levels at each node of the logical circuit, with a probe or probes being contacted to each node.

However, when a logical circuit becomes complex as a result of the fact that it is constructed of LSI integrated circuits, it can no longer be easily checked by the method described above.

In order to deal with this problem, ordinarily a check circuit is often incorporated in the logical circuit to be checked. Some techniques for overcoming the problem have heretofore been proposed; e.g. a circuit system for checking logical levels at each node of a logical circuit having latches to be used for a sequential circuit connected in series as in the case of LSSD, or pads provided on the LSI circuits to which a probe or stylus for checking the logical circuit is directly contacted. These techniques have, however, drawbacks in that these latches and pads are to be arranged irregularly in the LSI circuits.

Particularly, a recent predominating trend is that designs of the LSI circuits are being carried out by the use of automatic arrangement and wiring programs, when this approach is used, however, it becomes extremely difficult to provide for the latches and pads for which checks are required for identification on the LSI circuits, while the size of the integrated circuits becomes also large.

On the other hand, another method has also been proposed recently wherein internal nodes of a logical circuit are directly checked by the use of a EB tester. In this method as well, however, only relative potentials can be obtained and checking of logical circuits are not necessarily satisfactory.

SUMMARY OF THE INVENTION

It is an object of the present invention therefore to overcome the drawbacks described above and to provide an evaluation facilitating circuit device in which checking of each node of a logical circuit can be facilitated as well as improvement in the integration of a logical circuit and compactness in the logical circuit.

It is another object of the present invention to provide an evaluation facilitating circuit device having a plurality of latch circuits arranged in a matrix array in which signal levels at each node of a logical circuit to be checked are latched in the latch circuits at the same time so as to easily check the logical conditions of the logical circuit at a certain time point.

One feature of the present invention resides in an evaluation facilitating circuit device which comprises a data hold circuit having a plurality of the latch circuits arranged in a matrix array for receiving signal levels at each of nodes of a logical circuit to be checked and for latching the signal levels in the latch circuits in accordance with a write signal and address signals, and a data hold and transfer control circuit for producing a control signal and address signals and for controlling transfer of the data retained in the data hold circuit in accordance with a data hold signal and system clock signals from the logical circuit to be checked as well as address information from outside.

These objects, features and advantages of the invention will be better understood from the following description with reference to the accompanying drawings.

DETAILED DESCRIPTION OF THE PREFERRED EMBODIMENTS

Figure 1:
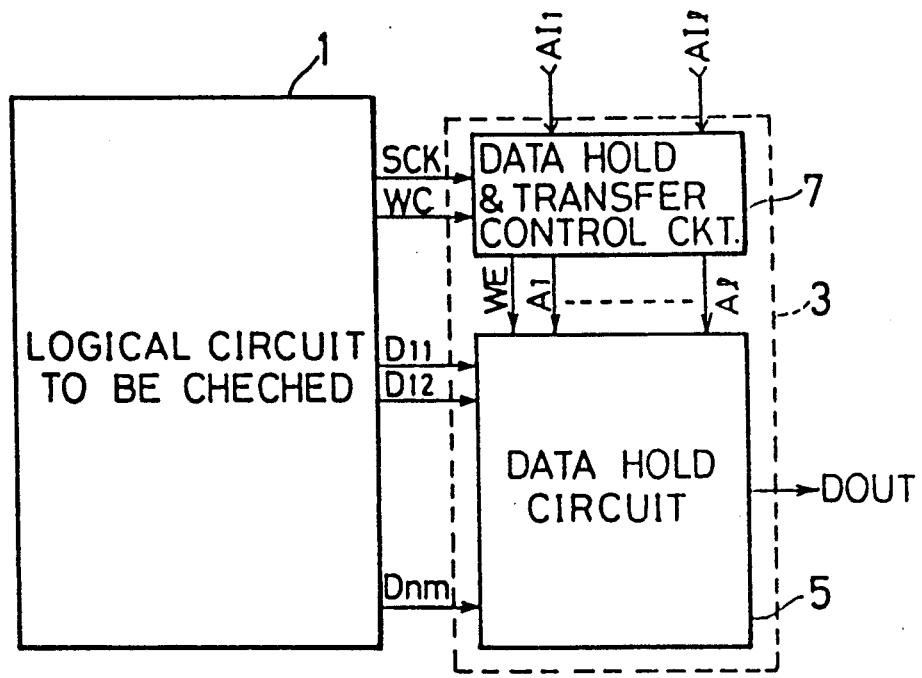
FIG. 1 is an overall circuit contraction of the evaluation facilitating circuit device embodYing the present invention, connected to a logical circuit to be checked.

Referring to FIG. 1, the evaluation facilitating circuit 3 embodying present invention is connected to a logical circuit 1 to be checked, so as to latch and check logical signal levels or the logical conditions of each node of the logical circuit 1 through the evaluation facilitating circuit 3. The logical circuit 1 may be the one having any circuit construction.

The evaluation facilitating circuit 3 comprises a data hold circuit 5 which receives and latches signal levels at each node of the logical circuit 1 through data lines $D_{11}$, $D_{12}$, ... $D_{nm}$ from the circuit 1, while address signals $A_1$ to $A_l$ and a write signal WE are applied from a data hold and transfer control circuit 7, so as to produce an output signal $D_{out}$ from the data hold circuit 5.

Address information $AI_1$ to $AI_l$ are supplied from outside to the data hold and transfer control circuit 7, while a system clock signal SCK and a data hold signal WC are supplied thereto from the logical circuit 1.

Figure 2:
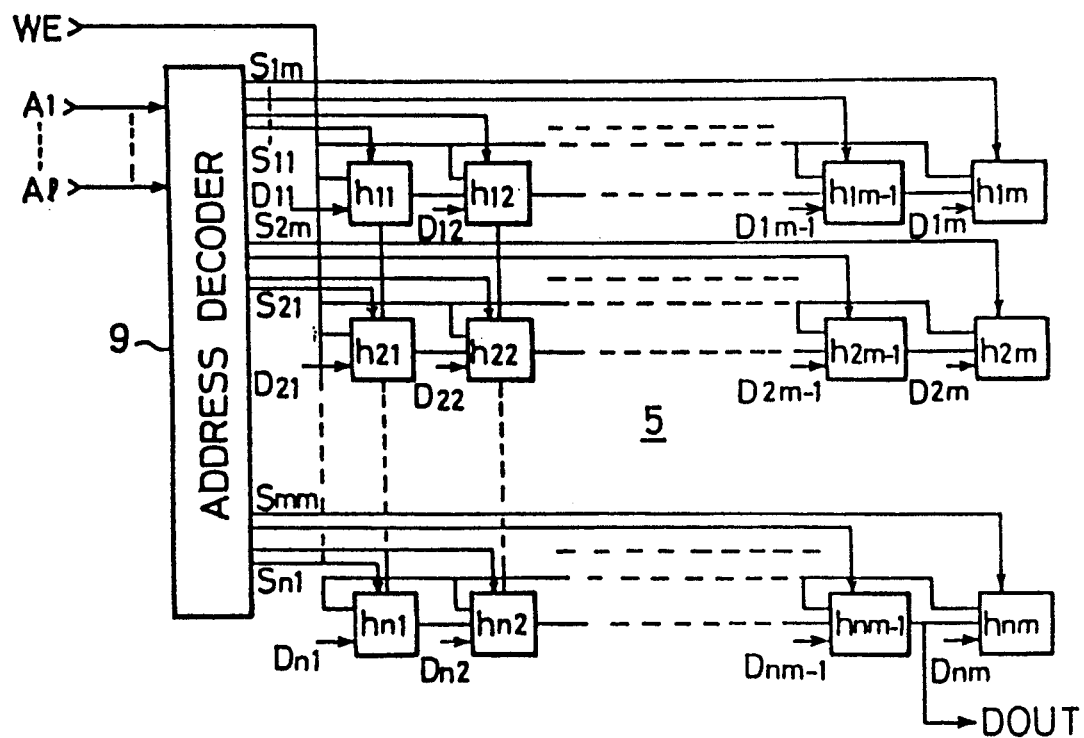
FIG. 2 is a detailed circuit contraction of the data hold circuit of FIG. 1.

The data hold circuit 5 comprises, as shown in FIG. 2, an address decoder 9 for decoding the address signals $A_1$ to $A_l$ supplied from the data hold and transfer control circuit 7, a plurality of latch circuits $h_{11}$, $h_{12}$, ... $h_{1m}$, $h_{21}$, $h_{22}$, ... $h_{2m}$, $h_{n1}$, $h_{n2}$, ... $h_{nm}$, arranged in an array of m x n matrix, each of which is designated by each of the output signals $S_{11}$, $S_{12}$, ... $S_{1m}$, $S_{21}$, ... $S_{2m}$, $S_{n1}$, ... $S_{nm}$ from the address decoder 9. This array structure of the latch circuits $h_{11}$ to $h_{nm}$ enables easy integration and compactness of the circuits and it also enables easy checking of the circuits by human eyes.

The data lines $D_{11}$, $D_{12}$, ... $D_{nm}$ from the logical circuit 1 are connected to each of the latch circuits $h_{11}$ to $h_{nm}$ and each of the latch circuits is supplied with the write signal WE in common.

Figure 3:
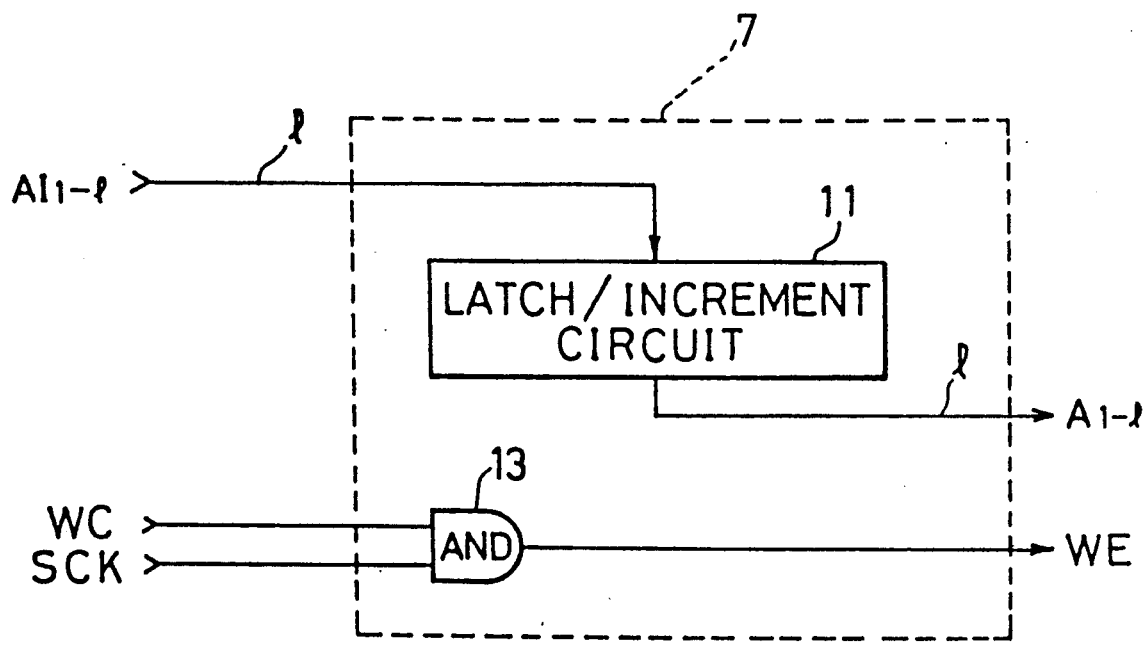
FIG. 3 illustrates a detailed circuit contraction of the data hold and transfer control circuit of FIG. 1.

FIG. 3 shows one embodiment of the data hold and transfer control circuit 7 which comprises a latch increment circuit 11 which holds leading address signals $AI_1$ to $AI_l$ supplied from outside and produces address signals $A_1$ to $A_l$ by successive increment of the leading address information $AI_1$ to $AI_l$ thus held, and an AND circuit 13 which takes a logical product of the data hold signal WC and the system clock signal SCK and produces the write signal WE.

The operation of the evaluation facilitating circuit thus constructed will now be described with reference to the figures. The following description is made at first about a case where signal levels at each node of the logical circuit 1 should be held in each of the latch circuits $h_{11}$ to $h_{nm}$ of the data hold circuit 5.

The data hold signal WC is produced from the logical circuit 1 and a logical product of the data hold signal WC thus produced and the system clock signal SCK is taken at the AND circuit 13. The resulting write signal WE from the AND circuit 13 is applied to each of the latch circuits $h_{11}$ to $h_{nm}$ in the data hold circuit 5.

Since each of the latch circuits $h_{11}$ to $h_{nm}$ is connected to each node of the logical circuit 1 through the data lines $D_{11}$ to $D_{nm}$, when the write signal WE is applied to each of the latch circuits $h_{11}$ to $h_{nm}$, signal levels at each node in the logical circuit 1 are applied at the same time to each of the corresponding latch circuits $h_{11}$ to $h_{nm}$ through the data lines $D_{11}$ to $D_{nm}$ and they are latched therein. Namely, the signal levels at each node in the logical circuit 1 at a certain time point are at the same time latched, so that the logical conditions of the logical circuit 1 at the certain time point may be checked.

In the manner as described in the foregoing, the signal levels at each node of the logical circuit 1 are retained in the latch circuits $h_{11}$ to $h_{nm}$ and they are read out from the latch circuits designated by the leading address information $AI_1$ to $AI_l$ supplied to the data hold and transfer control circuit 7 from outside and are produced from the data hold circuit 5 as an output signal $D_{out}$. That is, the address information $AI_1$ to $AI_l$ are temporarily stored in the latch/increment circuit 11 of the data hold and transfer control circuit 7 and they are applied to the address decoder 9 of the data hold circuit 5 as address signals $A_1$ to $A_l$. The address decoder 9 decodes these address signals and it produces corresponding output signal $S_{ii}$. The signal level thus retained in the latch circuit $h_{ii}$ for instance, is output as an output signal $D_{out}$ when the output signal $S_{ii}$ is supplied to the latch circuit. Afterwards, the address signals $A_1$ to $A_l$ are successively incremented by the latch/increment circuit 11 and the signal levels retained in the latch circuits corresponding to the address signals thus incremented are produced as the output signal $D_{out}$ one by one, thus enabling the signal levels at each node in the logical circuit 1 to be successively checked.

The evaluation facilitating circuit according to the present invention may be mounted on a multi-layer wiring board and the data lines $D_{11}$, $D_{12}$, ... $D_{nm}$ for picking up the signal levels at each node in the logical circuit 1 can be wired on the topmost layer of the multi-layer wiring board (not shown), thus obviating the increase in the chip size of the integrated circuits due to the increase in the number of wirings.

In the evaluation facilitating circuit device according to the present invention, each of the latch circuits $h_{11}$ to $h_{nm}$ constructed in a matrix array is connected to each node of the logical circuit 1. Accordingly, when the write signal WE is applied to each of the latch circuits, the signal levels at each node can be retained in the latch circuits $h_{11}$ to $h_{nm}$ at the same time and the signal levels at each node of the logical circuit 1 can be read out by their address information and they are checked.

Moreover, in the foregoing embodiment, according to the present invention, since the logical circuit 1 to be checked and the evaluation facilitating circuit 3 are constructed independently so as to easily separate each other in its circuit construction, the evaluation facilitating circuit 3 can be manufactured independently, with the logical circuit 1 removed from it when munufacturing the evaluation facilitating circuit, except for a trial assembling of the logical circuit 1 and the evaluation facilitating circuit combined.

In addition, in the evaluation facilitating circuit according to the present invention, since a plurality of latches for latching logical signal levels at each node of a logical circuit are constructed in a matrix array, a high degree of integration of the LSI circuits becomes possible and the conditions of each of nodes of the logical circuit to be checked can easily be carried out.

There will be described a second embodiment of an evaluation facilitating circuit according to the present invention.

Figure 4:
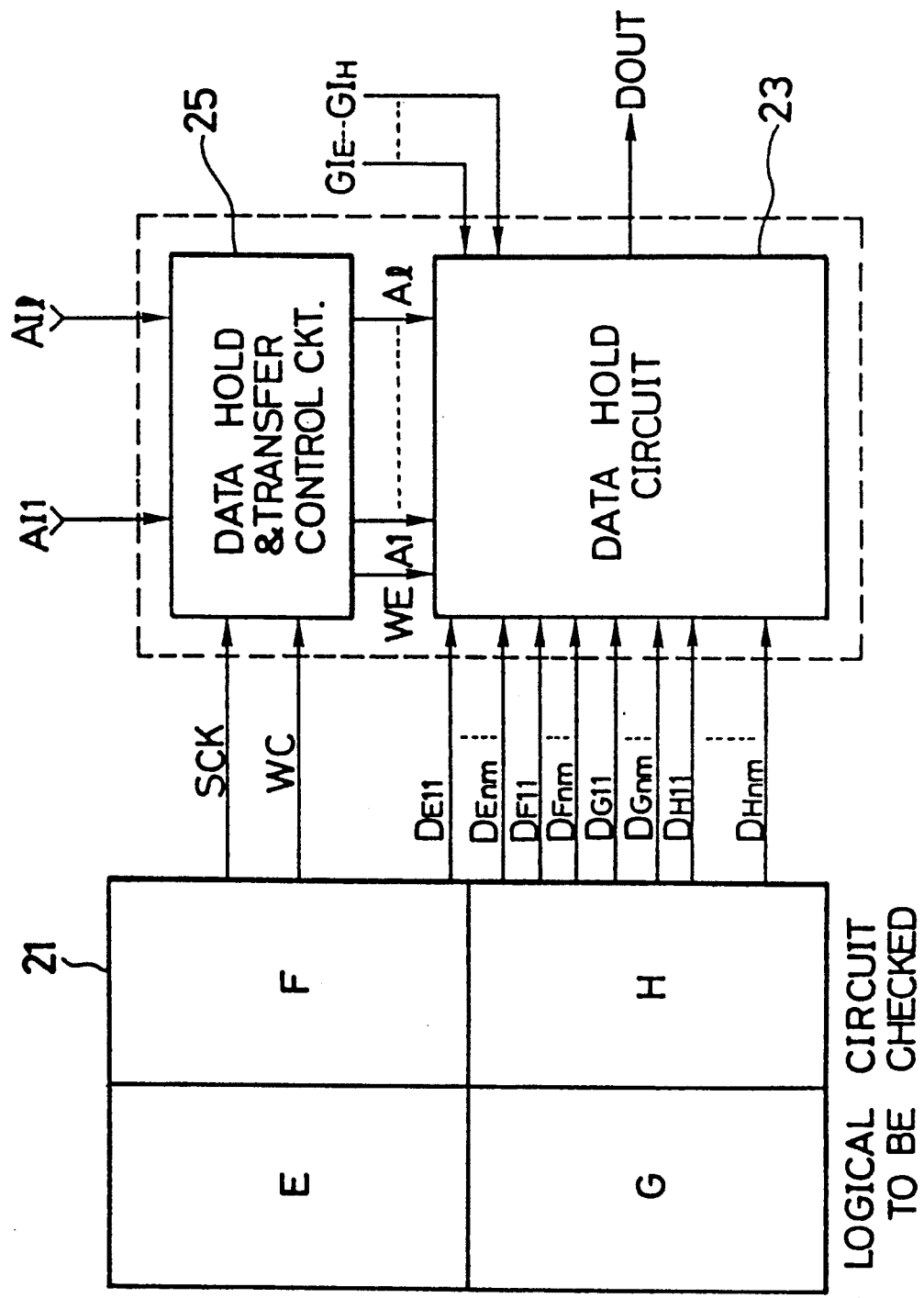
FIG. 4 is an overall circuit construction of the second embodiment of the evaluation facilitating circuit device according to the present invention.

As shown in FIG. 4, this second embodiment is for selectively evaluating each block of a logical circuit to be checked 21 which is divided into a plurality of blocks E, F, G and H. The evaluation facilitating circuit includes a data hold circuit 23 for selectively latching level signals of nodes of each block and a data hold and transfer control circuit 25 for controlling the data hold circuit 23.

Figure 5:
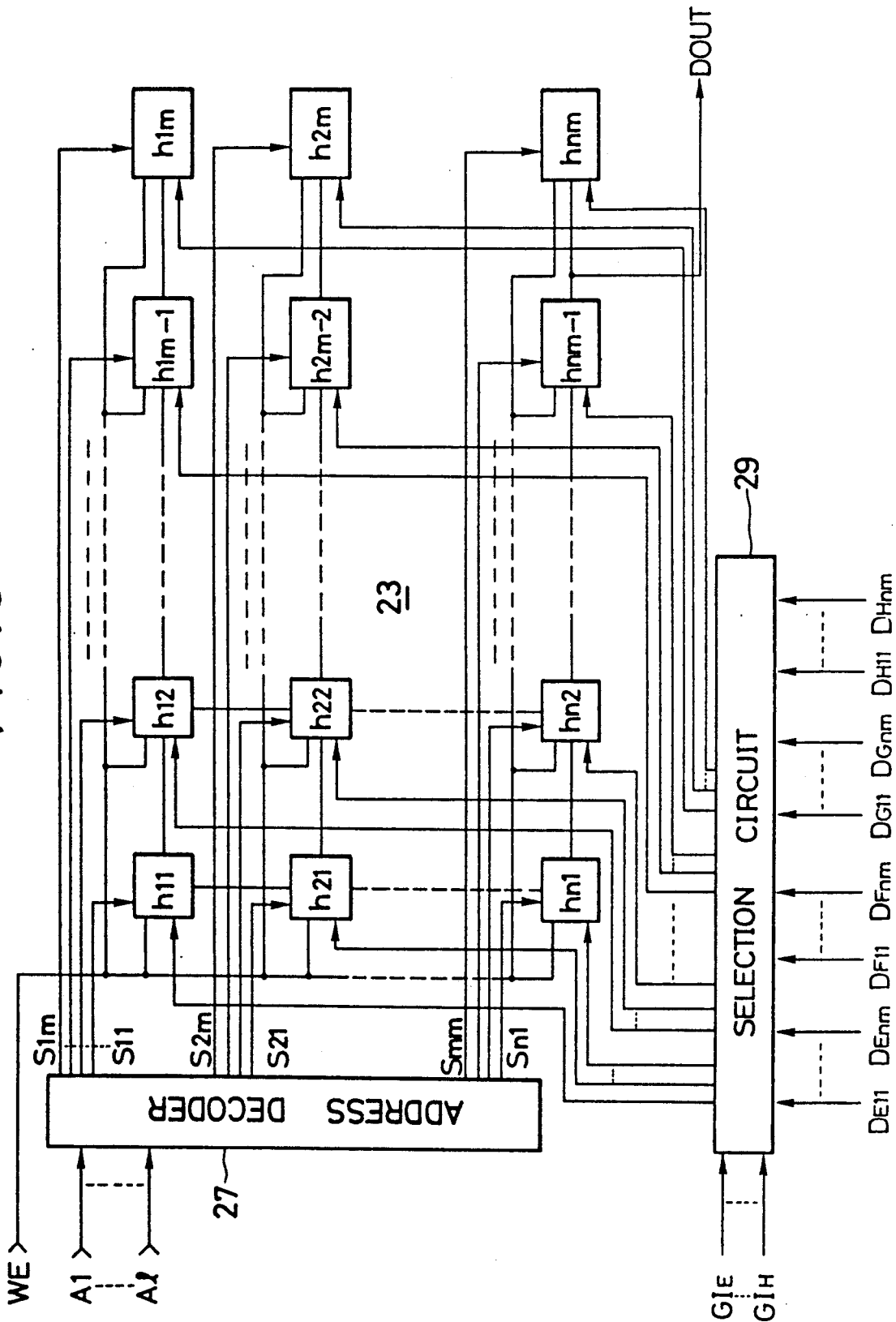
FIG. 5 is a detailed circuit construction of the data hold circuit of FIG. 4.

The data hold circuit 23 comprises, as shown in FIG. 5, an address decoder 27 for decoding the address signals $A_1$ to $A$ supplied from the data hold and transfer control circuit 25, a plurality of latch circuits $h_{11}$, $h_{12}$, ... $h_{1m}$, $h_{21}$, $h_{22}$, ... $h_{2m}$, $h_{n1}$, $h_{n2}$, ... $h_{nm}$, arranged in an array of m x n matrix, each of which is designated by each of the output signals $S_{11}$, $S_{12}$, .. $S_{1m}$, $S_{n1}$, ... $S_{nm}$, from the address decoder 27, and a selection circuit 29 for receiving level signals of nodes of all blocks through data lines $D_{E11}$ ... $D_{Enm}$, $D_{F11}$ ... $D_{Fnm}$, $D_{G11}$ ... $D_{Gnm}$, and $D_{H11}$ ... $D_{Hnm}$, and for selecting the level signals of the nodes of one of the blocks in accordance with one of block selection signals $GI_E$ ... $GI_H$ to supply the selected level signals of the selected block to the latch circuits $h_{11}$ ... $h_{nm}$. The block selection signals $GI_E$ ... $GI_H$ are supplied from outside to the selection circuit 29 to select one block from the blocks E ... H. The data hold and transfer control circuit 25 of this embodiment has the same construction of that of the first embodiment.

The operation of this second embodiment will be described as following.

The following description is made at first about a case where signal levels at each node of the block E of the logical circuit 21 is held in each of the latch circuits $h_{11}$ to $h_{nm}$ of the data hold circuit 23.

The data hold signal WC is outputted from the logical circuit 21. A logical product of the data hold signal WC and a system clock signal SCK is taken at an AND circuit of the data hold and transfer control circuit 25. The resulting write signal WE from the AND circuit is applied to each of the latch circuits $h_{11}$ to $h_{nm}$ in the data hold circuit 23.

The block selection signal $GI_E$ is supplied to the selection circuit 29 of the data hold circuit 23 to select the block E. The selection circuit 29 selects level signals of block E from the level signals supplied through the data lines $D_{E11}$ ... $D_{Enm}$ to supply the selected level to the latch circuit $h_{11}$ ... $h_{nm}$. Therefore, the levels at each node of the block E of the logical circuit 21 are supplied at the same time to each of the corresponding latch circuits $h_{11}$ ... $h_{nm}$ through the data lines and they are latched therein. Namely, the signal levels at each node of the block E in the logical circuit 21 at a certain time point are at the same time latched, so that the logical conditions of the block E in the logical circuit 21 at the certain time point may be checked.

Check operations of other blocks F, G, H are carried out respectively by supplying each of the block selection signal $GI_F$, $GI_G$, $GI_H$ to the selection circuit 29 in the same manner.

In the manner as described in the foregoing, the signal levels at each node of the block E of the logical circuit 21 are retained in the latch circuits $h_{11}$ to $h_{nm}$ and they are read out from the latch circuits designated by the leading address information $AI_1$ to $AI_l$ supplied to the data hold and transfer control circuit 25 from outside and are produced from the data hold circuit 23 as an output signal $D_{out}$. That is, the address information $AI_1$ to $AI_l$ are temporarily stored in the latch/increment circuit of the data hold and transfer control circuit 25 and they are applied to the address decoder 27 of the data hold circuit 23 as address signals $A_1$ to $A_l$. The address decoder 27 decodes these address signals and it produces corresponding output signals $S_{ii}$. The signal level thus retained in the latch circuit $h_{ii}$ for instance, is outputted as an output signal $D_{out}$ when the output signal $S_{ii}$ is supplied to the latch circuit. Afterwards, the address signals $A_1$ to $A_l$ are successively incremented by the latch/increment circuit of the data hold and transfer control circuit 25 and the signal levels retained in the latch circuits corresponding to the address signals thus incremented are produced as the output signal $D_{out}$ one by one, thus enabling the signal levels at each node of the block E in the logical circuit 21 to be successively checked.

As described above, in this second embodiment, each of the block E . . . H of the logical circuit to be checked 21 is selectively checked by one evaluation facilitating circuit. Therefore, it is not necessary to provide a plurality of evaluation facilitating circuits for the plurality of blocks, whereby it is possible to check each of the blocks without the futile construction of the circuit.

While the invention has been described in its preferred embodiment, it is to be understood that the words which have been used are words of description rather than limitation and that various changes and modifications may be made within the purview of the appended claims without departing from the true scope and spirit of the invention in its broader aspects.

What is claimed is:

1. An evaluation facilitating circuit for evaluating a logical circuit which is divided into a plurality of blocks, comprising:
    (a) latch means for latching level signals at each of the nodes in one of said blocks of said logical circuit, said latch means comprising a plurality of latch circuits arranged in a matrix array and a data hold and transfer control circuit for controlling the latch operation of each of said latch circuits and a transfer operation in which latched level signals are transferred externally, latched data in said latch means reflecting an instant condition of said nodes in one block; and
    (b) a selection circuit for selecting level signals of nodes of one block of said blocks from the level signals of nodes of the other blocks of said blocks and for supplying said selected level signals of said one block to said latch means in order to represent a condition of said one block by a condition of said latch means.

2. The evaluation facilitating circuit as claimed in claim 1, wherein said selection circuit is constructed for receiving the level signals of nodes of said plurality of said all blocks through data lines.

* * * * *